(12) United States Patent
Larsen et al.

(10) Patent No.: US 11,102,894 B2
(45) Date of Patent: Aug. 24, 2021

(54) SADDLE TYPE ELECTRICAL ENCLOSURE

(71) Applicant: The Boeing Company, Chicago, IL (US)

(72) Inventors: Ty A. Larsen, Everett, WA (US); Yakentim M. Ibrahim, Brier, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/740,193

(22) Filed: Jan. 10, 2020

(65) Prior Publication Data
US 2021/0219440 A1   Jul. 15, 2021

(51) Int. Cl.
*H05K 5/00* (2006.01)
*H05K 5/03* (2006.01)
*H05K 5/02* (2006.01)
*H05K 1/14* (2006.01)

(52) U.S. Cl.
CPC ........... *H05K 5/0052* (2013.01); *H05K 1/144* (2013.01); *H05K 5/006* (2013.01); *H05K 5/0008* (2013.01); *H05K 5/0247* (2013.01); *H05K 5/03* (2013.01); *H05K 2201/042* (2013.01)

(58) Field of Classification Search
USPC ........................................................ 361/752
See application file for complete search history.

(56) References Cited

U.S. PATENT DOCUMENTS

| | | | | |
|---|---|---|---|---|
| 5,718,605 A | * | 2/1998 | Morikawa .......... | H01R 12/7047 439/607.27 |
| 5,844,784 A | * | 12/1998 | Moran ................. | H05K 9/0032 361/818 |
| 6,384,324 B2 | * | 5/2002 | Flegeo ................. | H05K 5/0034 361/752 |
| 6,557,715 B2 | * | 5/2003 | Ikeda ..................... | H05K 7/142 220/4.02 |
| 8,797,763 B2 | * | 8/2014 | Fukunaga et al. ... | H05K 7/1417 174/50 |
| 9,001,516 B2 | * | 4/2015 | Nakayama ........... | H05K 5/0073 361/747 |
| 10,826,247 B1 | * | 11/2020 | Gilbert ............... | H01R 13/6596 |

* cited by examiner

*Primary Examiner* — Hung S. Bui
(74) *Attorney, Agent, or Firm* — Felix L. Fischer

(57) ABSTRACT

A printed circuit board enclosure employs a box having an open base and opposing side plates. Securing tabs extend laterally from the side plates. The securing tabs have bottom surfaces that are coplanar extensions of a bottom surface of the box and are configured to be attached to the main circuit board. A cover is received on the box. The cover is configured to close the open top of the box. The cover has side flanges extending downwardly from a top plate with mating tabs extending laterally from the side flanges aligned with the securing tabs.

20 Claims, 18 Drawing Sheets

SADDLE TYPE ELECTRICAL ENCLOSURE

BACKGROUND INFORMATION

Field

This disclosure relates generally to the field of printed circuit (PC) board systems and, more particularly to an enclosure system for one or more PC boards (PCB) to be mounted on a main circuit board.

Background

Aircraft and other complex systems employ numerous printed circuit boards in various applications. It is often necessary to stack boards on a main circuit board for integrated connection capability. Current electronic enclosure designs for commercial aircraft use, as an example, tend to focus on bent sheet metal or milled metallic designs with connectors placed along an exterior of the enclosure. Electronic circuit boards are secured within these enclosures and require the use of standoff posts or slide-in rack edges. Wiring is connected to the enclosure mounted connectors. New electronic boards in development for aircraft cabin systems, however, are specifically designed to be as small as physically practical in order to reduce weight and installation impacts. Current sheet metal enclosure designs do not match well with this type of design approach, and such a traditional approach to enclosure design results in a box many times the size of the electronics which are housed therein. Traditional enclosures also require equally large securing methods, such as racks, to secure them within the aircraft.

SUMMARY

Exemplary implementations of a printed circuit board enclosure provide a box having an open base and opposing side plates. Securing tabs extend laterally from the side plates in the box. The securing tabs have bottom surfaces that are coplanar extensions of a bottom surface of the box and are configured to be attached to the main circuit board. a saddle flange. A cover is received on the box. The cover is configured to close the open top of the box. The cover has side flanges extending downwardly from a top plate with mating tabs extending laterally from the side flanges aligned with the securing tabs.

The exemplary implementations provide a method of mounting circuit boards to a main circuit board. A box having an open base and opposing side plates is received on an top surface of a main circuit board. A circuit board is received in the box, a bottom surface of the circuit board supported proximate peripheral edges on a saddle flange. A cover is received on the box, the cover constraining the circuit board and closing the open top of the box having side flanges extending downwardly from a top plate contacting a top surface of the main circuit board.

BRIEF DESCRIPTION OF THE DRAWINGS

The features, functions, and advantages that have been discussed can be achieved independently in various implementations of the present invention or may be combined in yet other implementations further details of which can be seen with reference to the following description and drawings.

DETAILED DESCRIPTION

The implementations described herein provide open base PCB enclosure that provides proper registration and spacing for at least one protected circuit board for installation onto a main circuit board, such as that employed in a Proximity Switch Electronic Unit (PSEU) in an example implementation. The enclosure provides integral cable strain relief and strong circuit board retention features. The PCB enclosure with PSEU circuit board modification also can be configured for Electromagnetic Interference (EMI) protection, while still allowing for removal and repair.

Figure 1:
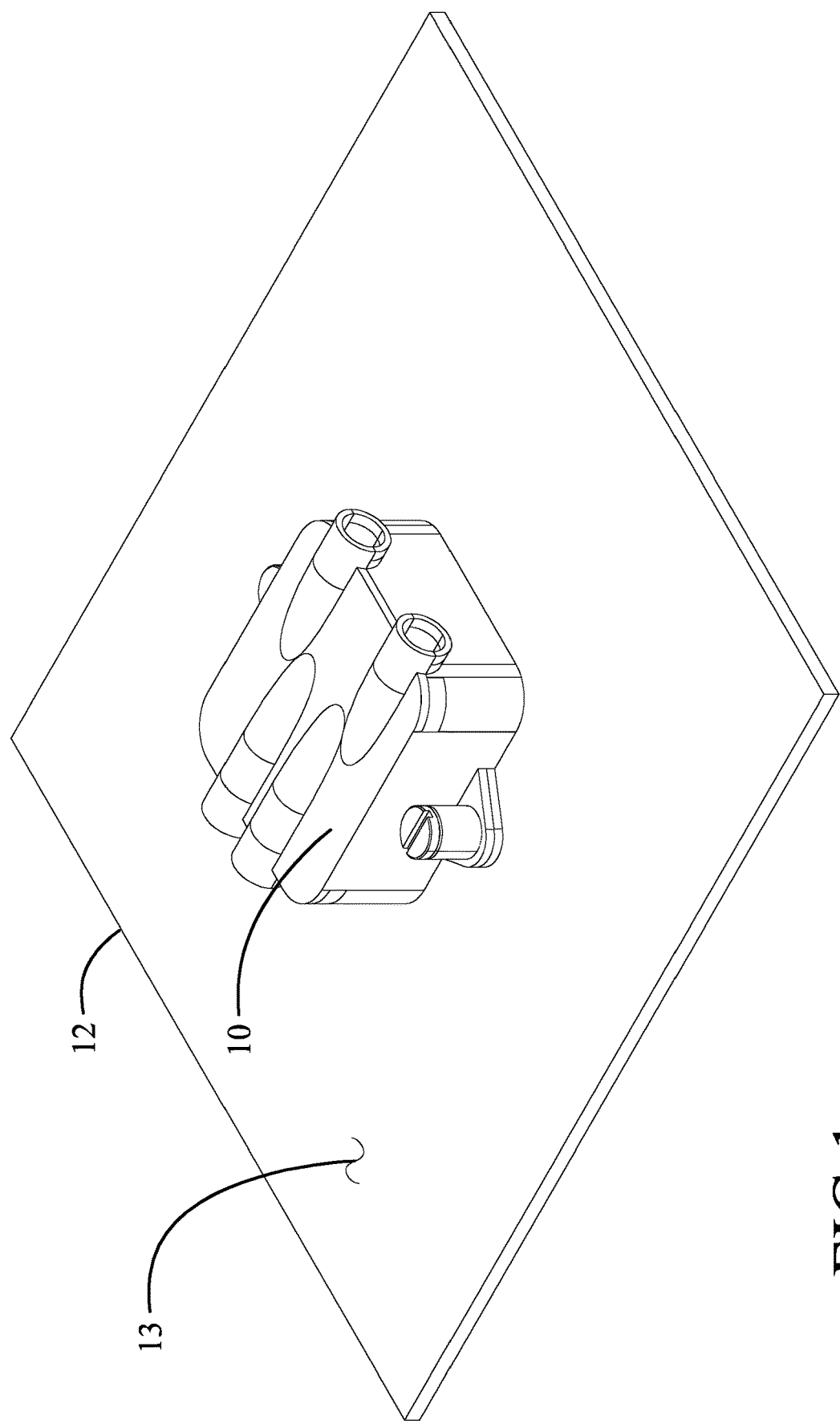
FIG. 1 is a pictorial representation of a first implementation of the PCB enclosure as mounted on a main circuit board.
Figure 2:
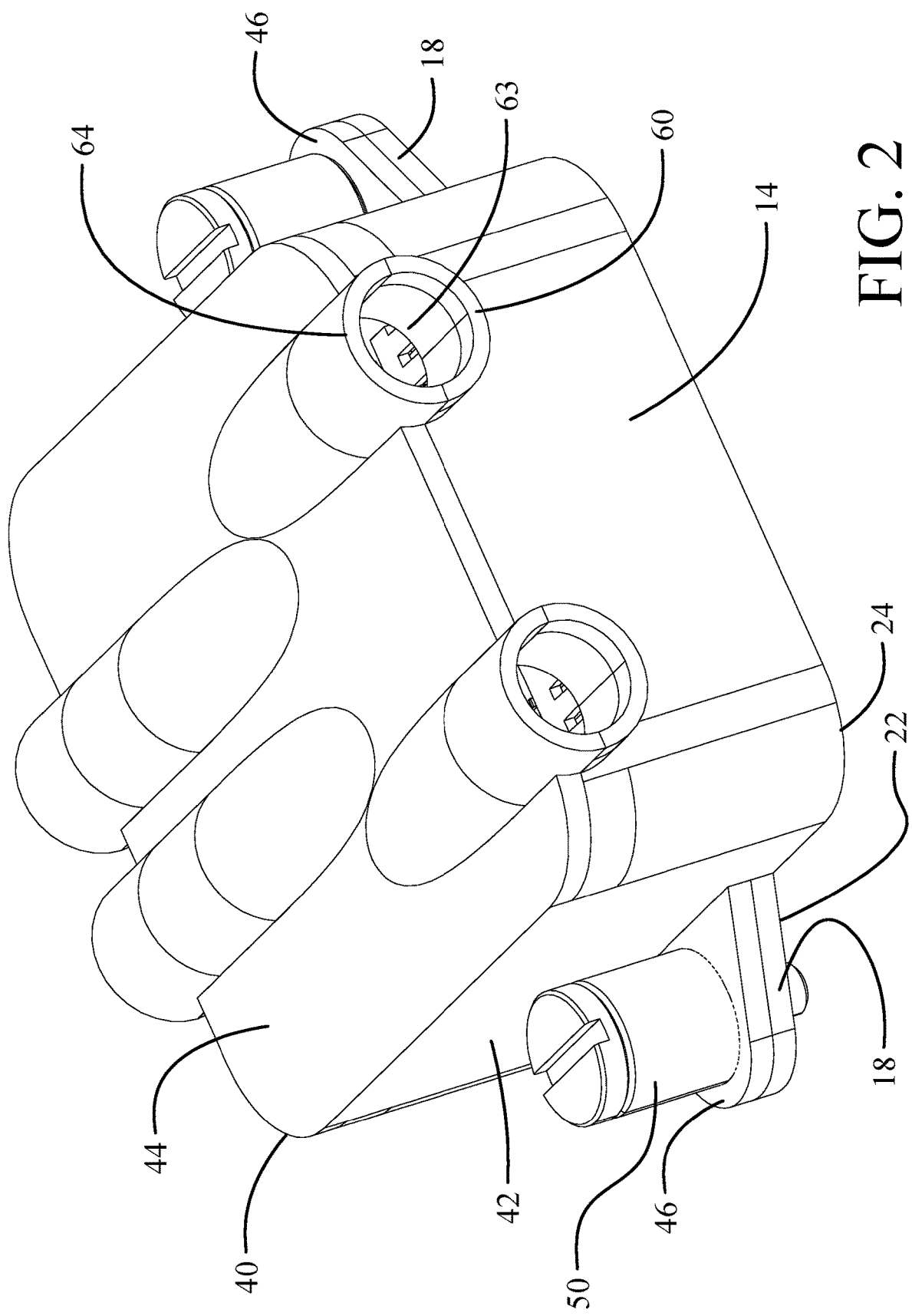
FIG. 2 is a detailed pictorial view of the first implementation.
Figure 3:
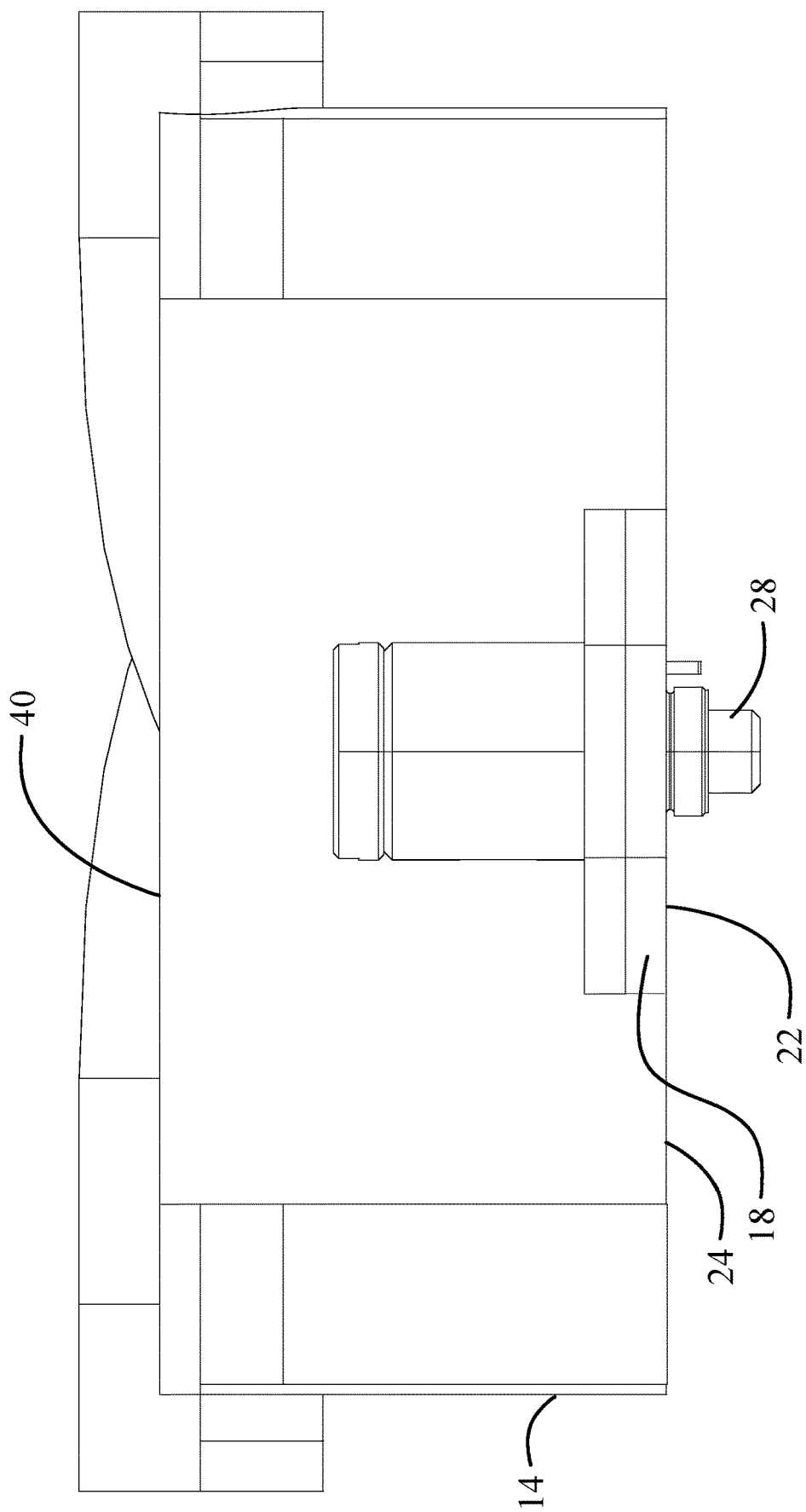
FIG. 3 is a side view of the first implementation.
Figure 4:
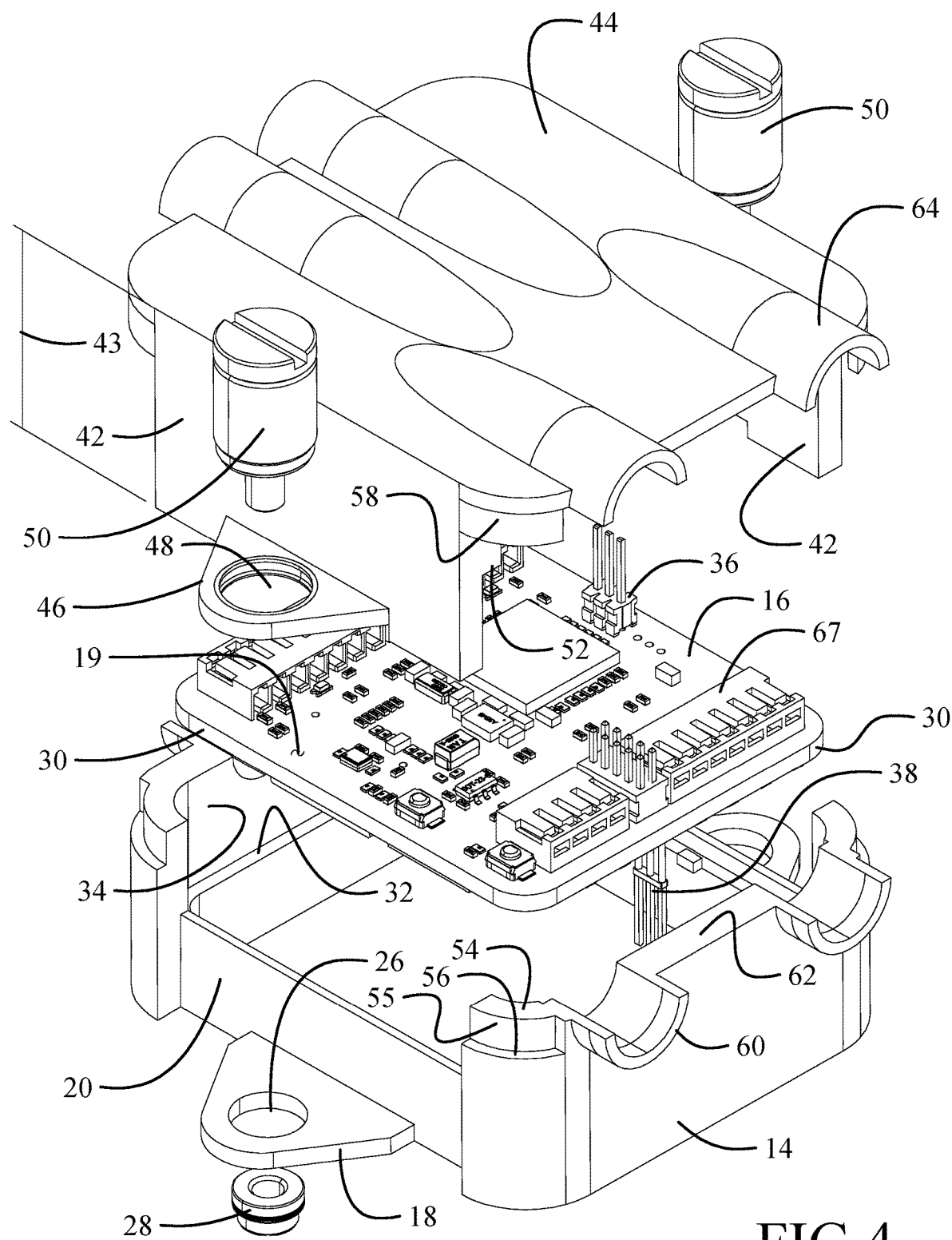
FIG. 4 is an exploded pictorial view of the first implementation with details of the box and cover for mounting the circuit board.

Referring to the drawings, FIG. 1 shows an example implementation of the PCB enclosure 10 as mounted to a main circuit board 12. As seen in detail in FIGS. 2-4, an open base box 14 houses a planer element such as a circuit board 16. In the first implementation, the box 14 has securing tabs 18 extending laterally from opposing side plates 20 (seen in FIG. 4). Bottom surfaces 22 of the securing tabs 18 are coplanar extensions of a bottom surface 24 of the box 14 for flush fit against the main circuit board 12 and are configured to be attached to the main circuit board. The securing tabs 18 are configured with apertures 26 sized to received industry standard printed circuit board swaging nuts 28 (best seen in FIGS. 3 and 4) on the main circuit board 12. This provides registration for both the box 14 and for the supported circuit board 16 relative to the main circuit board 12. The circuit board 16 is received in the box 14 and a bottom surface 17 of the circuit board is supported proximate peripheral edges 30 on a saddle flange 32. The peripheral edges 30 of the circuit board 16 are laterally constrained by the inner walls 34 of the box. As the circuit board 16 is pressed onto the saddle flange 32, one or more high density connectors 36 are properly aligned to the matching plugs 38 on the main circuit board 12 based on alignment and clocking of the securing tabs 18.

A cover 40 is received on the box 14 to constrain the circuit board 16 and close the open top of the box 14. Side flanges 42 extend downwardly from a top plate 44 of the cover 40. The side flanges are configured to be secured to the main circuit board. For the first implementation, mating tabs 46 extend laterally from the side flanges 42 and are aligned with the securing tabs 18. Mating apertures 48 in the mating tabs 46 align with the apertures 26 in the securing tabs 18. Fasteners 50 extend through the mating apertures 48 to be received in the swaging nuts 28 thereby engaging the cover 40 to the box 14 and further securing the complete PCB enclosure 10 to the main circuit board 12. The side flanges 42 incorporate steps 52 engaging a top surface 19 of the circuit board 16 proximate the peripheral edges 30 trapping the circuit board in engagement with the saddle flange 32. In this way the circuit board 16 is properly installed, the height is set at a level to maintain the electrical connections with the main circuit board 12, and the circuit board 16 is fully secured from additional movement. For the example implementation, the side plates 20 are recessed and the side flanges 42 are received in the recesses (annotated as element 53) providing flush outer side surfaces of the PCB enclosure 10. Also, for the implementation shown, the upper corners 54 of the box 14 have recesses (annotated as element 55) with terminating flats 56 that receive lips 58 extending downward from the top plate 44.

A plurality of half tubes 60 are incorporated in an upper edge 62 of the box 14 extending laterally from the box. The half tubes 60 are configured to receive braided cables engaged in connectors 67 on the circuit board 16. The braided cables are laid through the half tubes 60 as the circuit board 16 is inserted in the box. The cover 40 includes mating retention tubes 64 concentrically engaging the half tubes 60 forming harness conduits 63. After insertion of the circuit board in the box 14, the cover 40 is engaged to the box with the side flanges 42 received in the recesses in the side plates, trapping both the enclosed circuit board, as previously described, and the associated wire harnesses. The use of the swage nuts allows the top cover to be securely fastened down. The length 43 of the side flanges 42 engaging the top surface 13 of the main circuit board 12 and engagement of the mating tabs 46 on the securing tabs 18 along with engagement of the terminating flats 56 and lips 58 controls the height of the installed cover 40 to reduce any potential for over torqueing. Once tightened down with the fasteners 50, the cover 40 and box 14 fully trap the enclosed circuit board 16 and the wire harnesses, distributing any pulling load through the box and to the main circuit board 12 and swage nuts rather than the enclosed circuit board 16. For the example implementation in FIGS. 1-4, four half tubes 60 and mating retention tubes 64 for harness conduits are employed.

For the exemplary implementation, the box and cover are injection molded, 3D printed or milled from thermoplastic or other suitable material including, in exemplary implementations, ABS, Ultem and Nylon. Implementations may also employ aluminum, steel or titanium as machined or 3D additively manufactured elements. Multilayer electroplated plastics may also be employed. EMI protection may be incorporated through the use of carbon fiber or other conductive metallic stranding, vapor deposition coatings or similar material enhancements.

Figure 5:
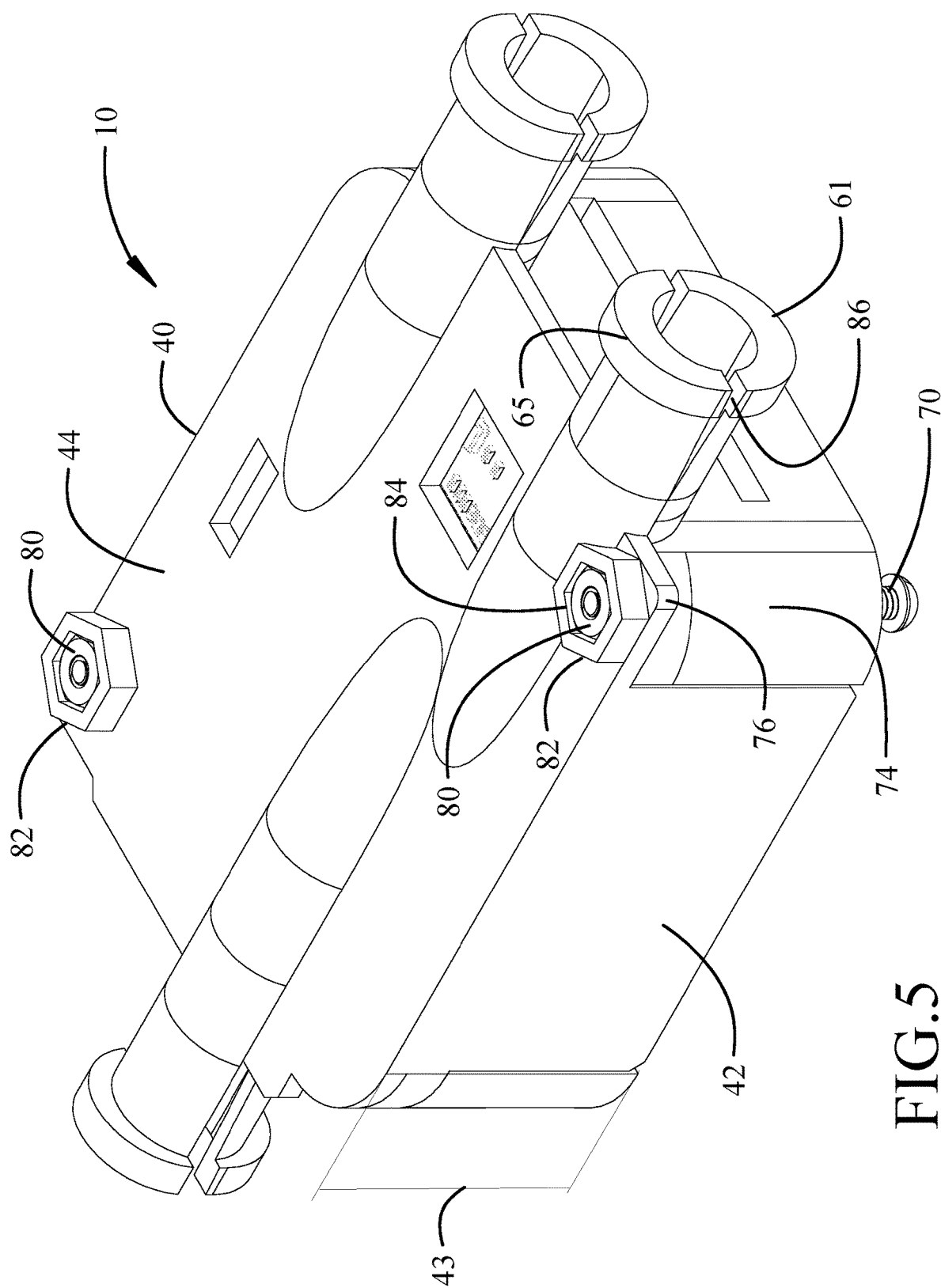
FIG. 5 is a pictorial view of a second implementation with an alternative securing system.
Figure 6:
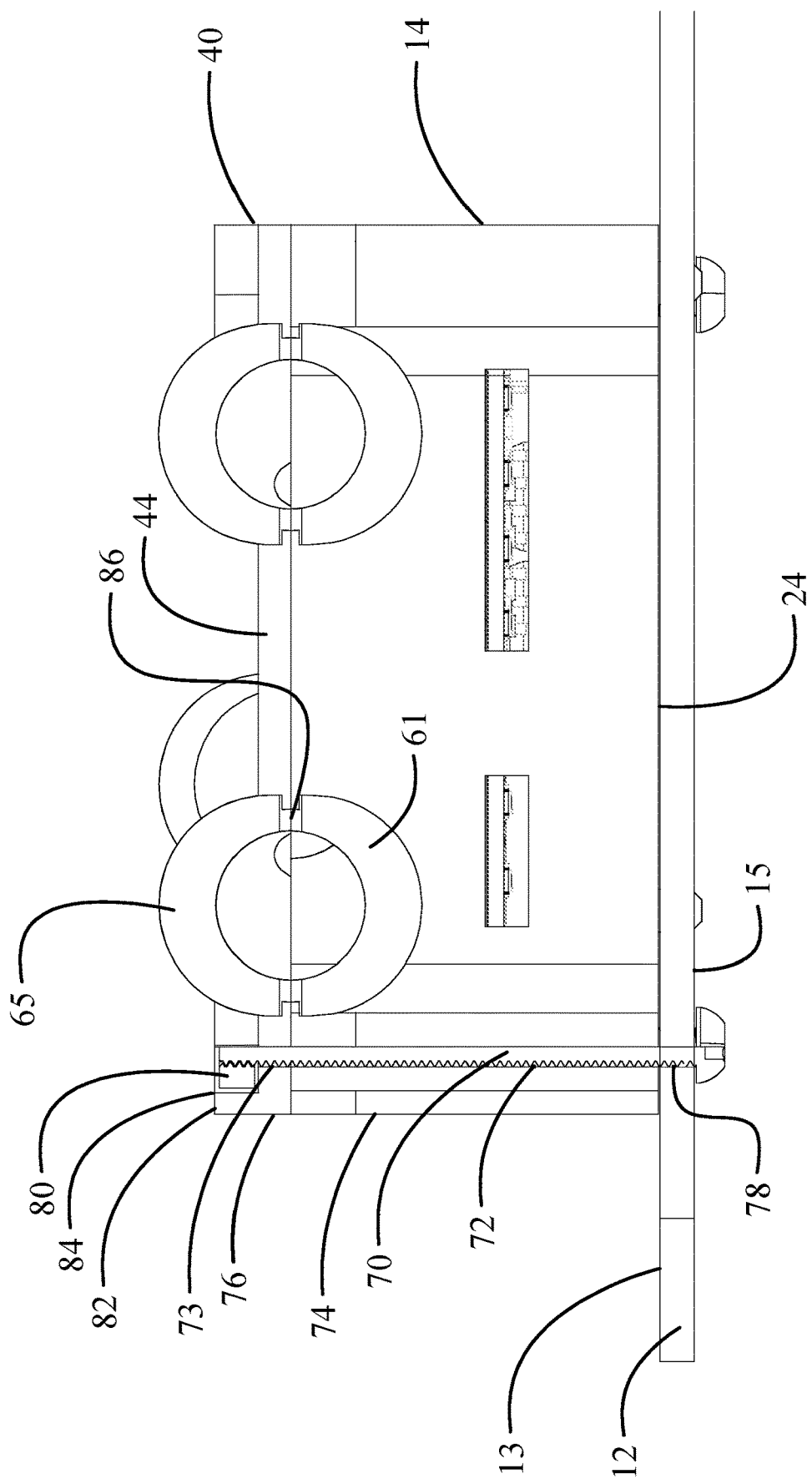
FIG. 6 is a partially sectioned end view of the second implementation.
Figure 7:
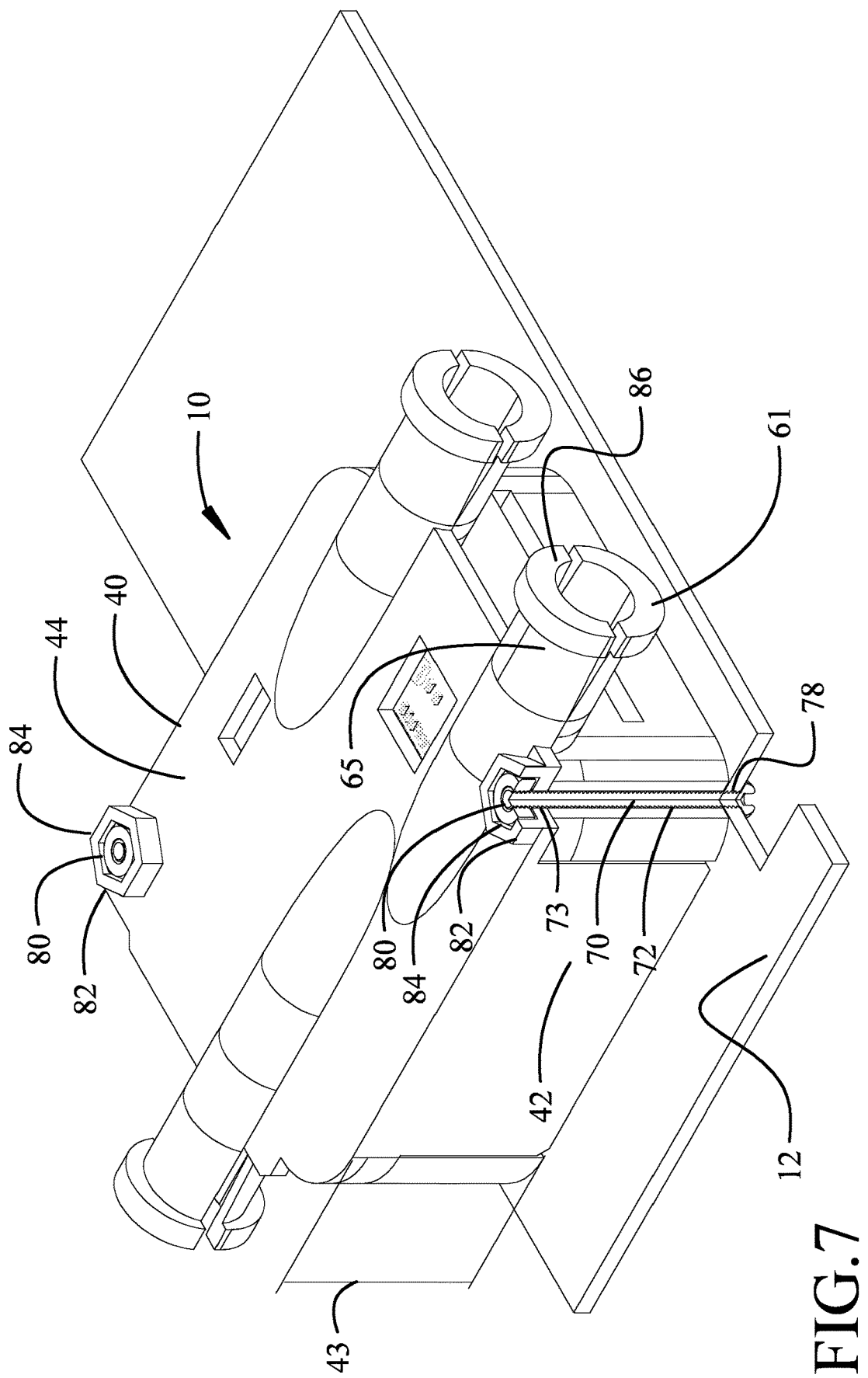
FIG. 7 is a partially sectioned pictorial representation of the second implementation as mounted on the main circuit board.

A second implementation of the PCB enclosure 10 is shown in FIGS. 5-7. As an alternative to the securing tabs and mating tabs of the first described implementation, mounting of the PCB enclosure 10 to the main circuit board 12 and securing of the cover 40 is accomplished with threaded corner studs 70 extending from the main circuit board. The bottom surface 24 of the box is received on a top surface 13 of the main circuit board 12 and bores 72 extend through at least two corners 74 of the box 14 and mating bores 73 in mating corners 76 of the top plate 44 of the cover 40 through which the threaded corner studs 70 are received. For the implementation shown, the sets of bores 72 and mating bores 73 are on diagonally opposed corners of the box and cover. In alternative implementations, four studs may be employed in the corners of the box or at other locations around the periphery of the box. In the example implementation shown, the threaded corner studs 70 extend through holes 78 in the main circuit board 12 to provide registration of the PCB enclosure 10 relative to the main circuit board comparable to the swaging nuts of the first implementation. The box 14 is inserted over the threaded corner studs 70. The circuit board 16 is installed in the box 14 and the cover 40 engaged over the corner studs which are received through the mating bores 73 in the mating corners 76 of the top plate 44. Nuts 80 secure the top plate 44 to the corner studs 70. Engagement bosses 82 are employed with matched recesses 84 to engage the nuts 80 allowing tightening of the studs 70 from an opposite side 15 of the main circuit board 12 from the PCB enclosure 10. Securing of the circuit board 16 within the box employing saddle flanges 32 and the configuration of the cover 40 with side flanges 42 with associated recesses, and steps and lips in the corners for secure registration and fit of the elements of the PCB enclosure 10 are substantially identical to the first described implementation. Length 43 of the side flanges 42 contacting the top surface 13 again constrains the height of the cover relative to the main circuit board 12.

The half tubes 61 and mating retention tubes 65 of the second implementation are similar in configuration to those of the first described implementation. However, tapering chamfers 86 provide clearance between the half tubes 61 and mating retention tubes 65 for clamping by tubing clamps or similar devices to enhance the engagement of the paired half tubes 61 and mating retention tubes 65 with the extending braided cables in the harness conduits 63.

Figure 8:
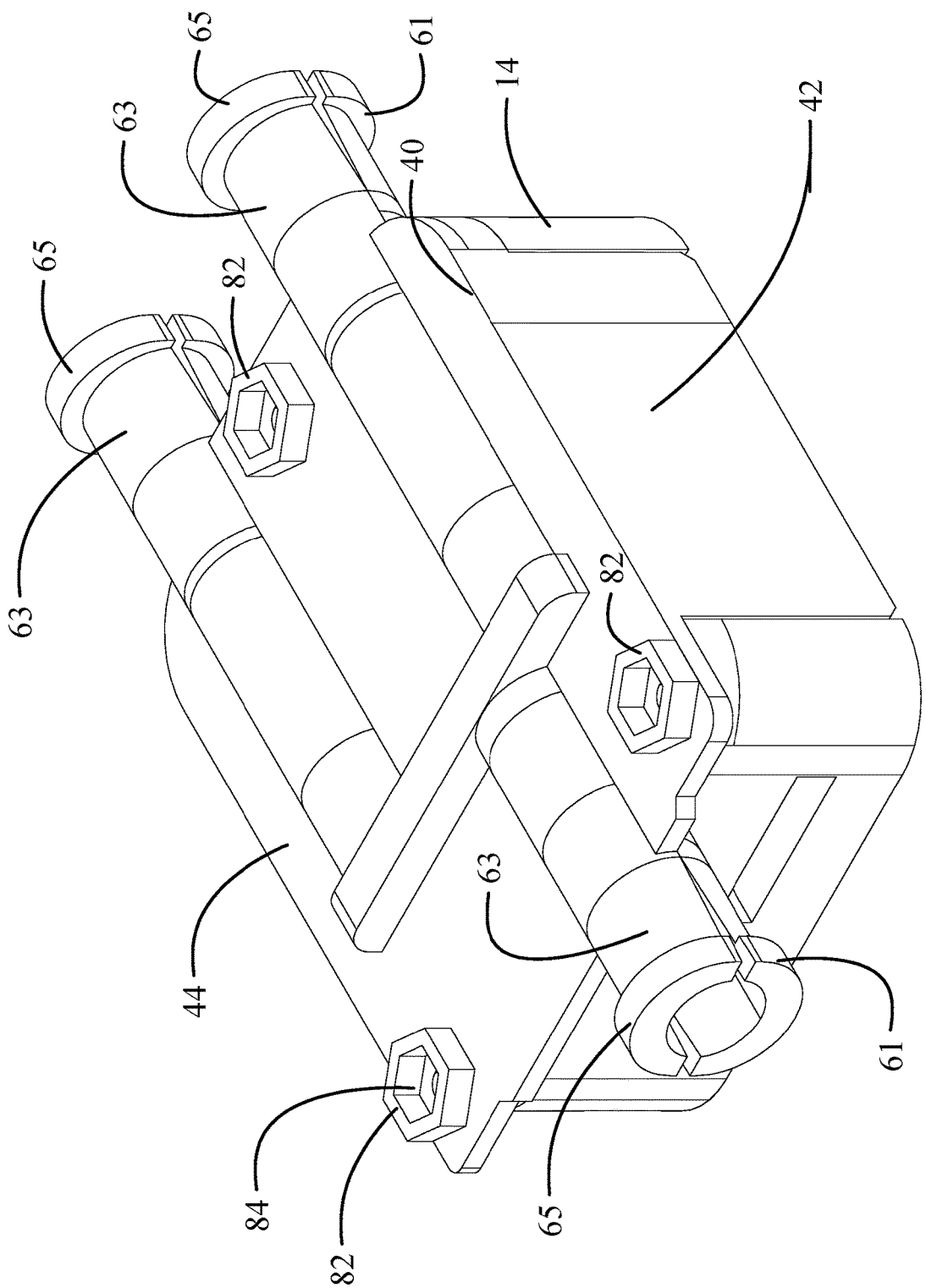
FIG. 8 is a pictorial view of a third implementation with alternative a second configuration of the alternative securing system.
Figure 9:
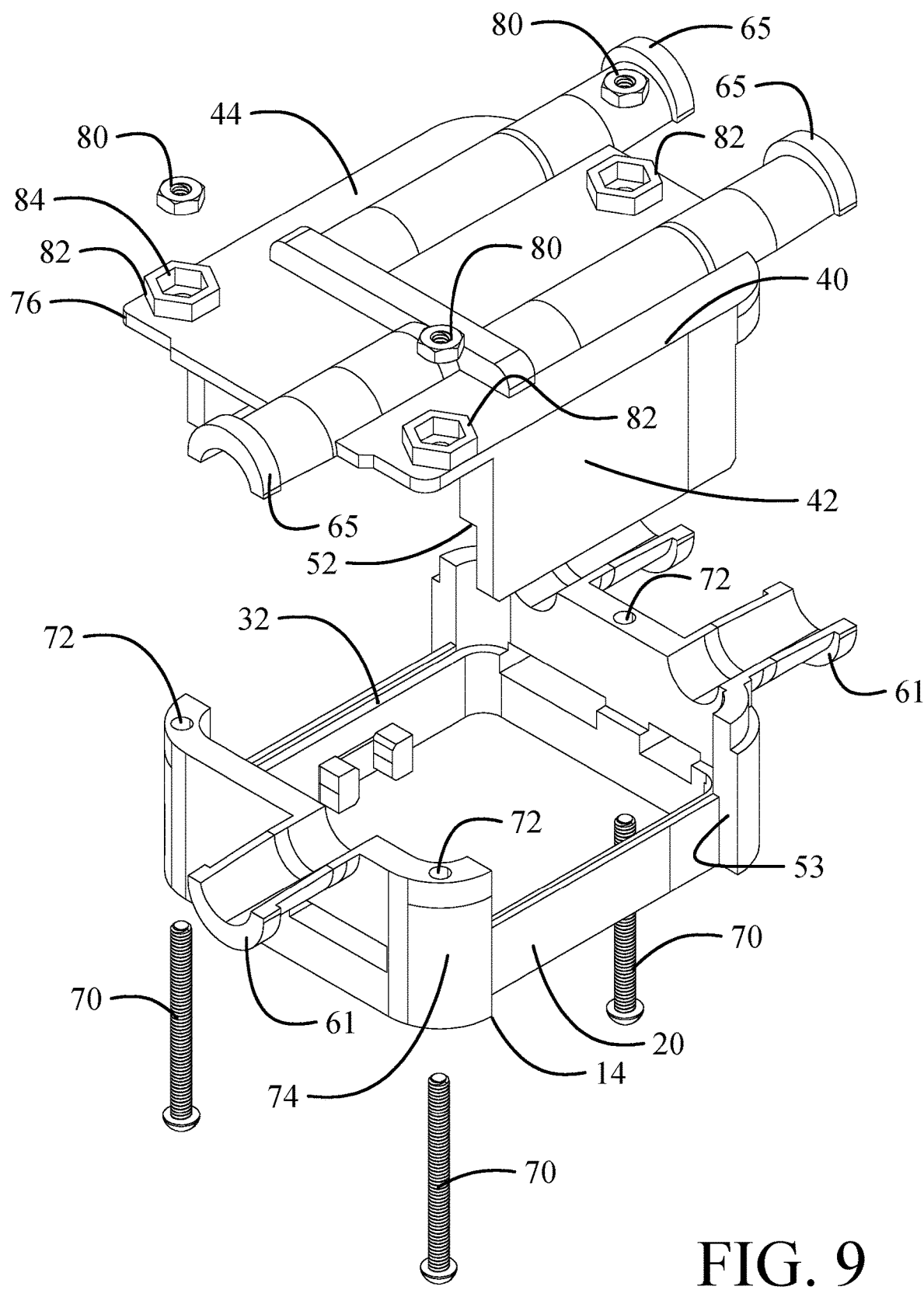
FIG. 9 is an exploded view of the third implementation showing details of the fastener locations.

As noted, placement of the bores 72 and mating bores 73 are alternatively placed at other locations around the periphery of the box. A third implementation, shown in FIGS. 8 and 9, employs three harness conduits 63 with sets of half tubes 61 and mating retention tubes 65, two extending from a first end of the box 14 and cover 40, respectively, and one extending from an opposite end. Placement of one set of a bore 72 and a mating bore 73 substantially centrally located on the first side between the two harness conduits and placement of two sets of bores 72 and mating bores 73 proximate corners of the box straddling the single harness conduit on the opposite end, provides optimum securing of the lid and box while providing clearance from the harness conduits. Assembly and securing of the cover 40 on the box 14 with studs 70 and nuts 80 is substantially identical to the second implementation. As seen in FIG. 9, the box for both the second and third implementations incorporates the saddle flange 32 and the side flanges 42 of the cover 40 incorporate the steps 52 engaging a top surface 19 of the circuit board 16 proximate the peripheral edges 30 trapping the circuit board in engagement with the saddle flange 32, as previously described with respect to the first implementation.

Figure 10:
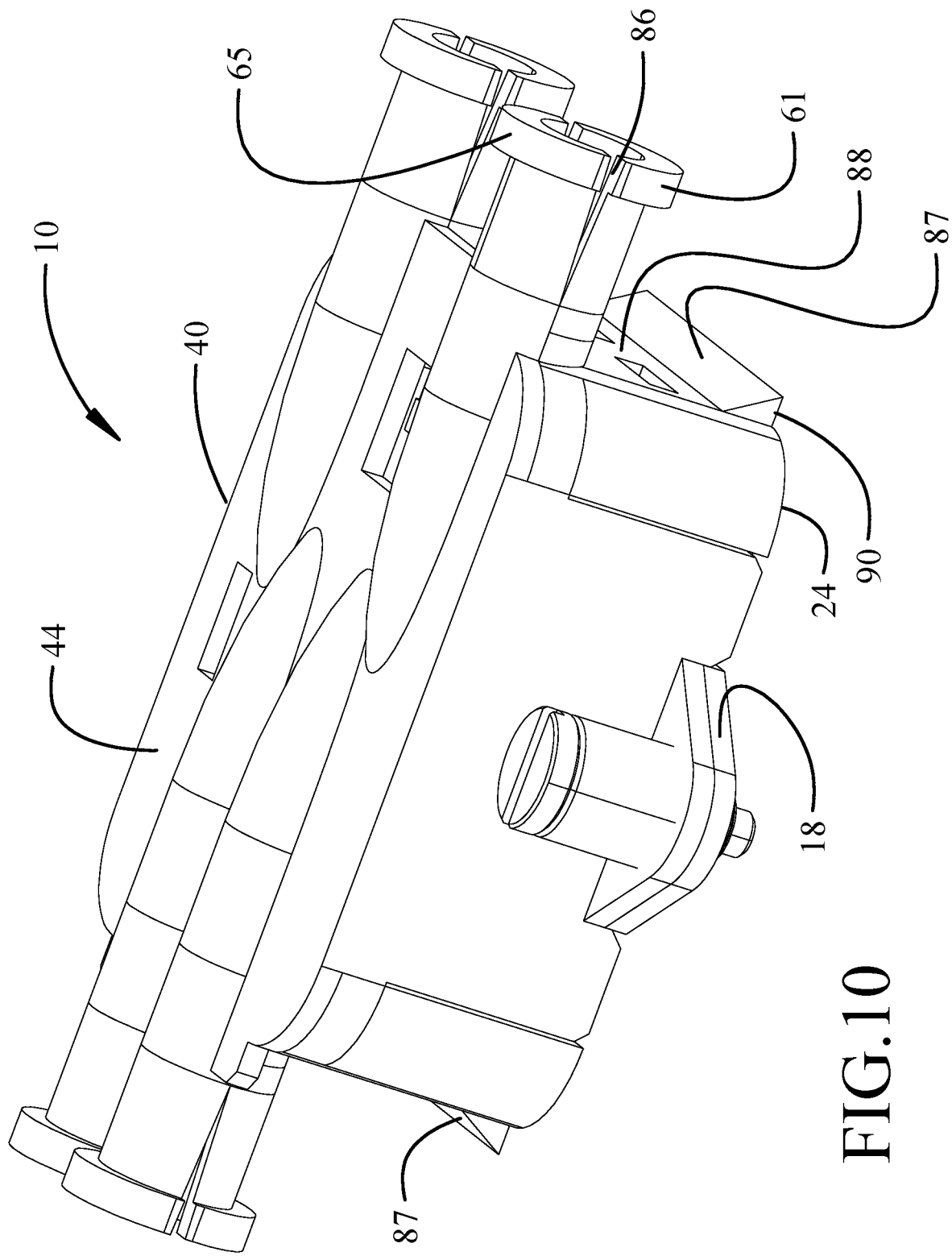
FIG. 10 is a pictorial representation of a fourth implementation.
Figure 11:
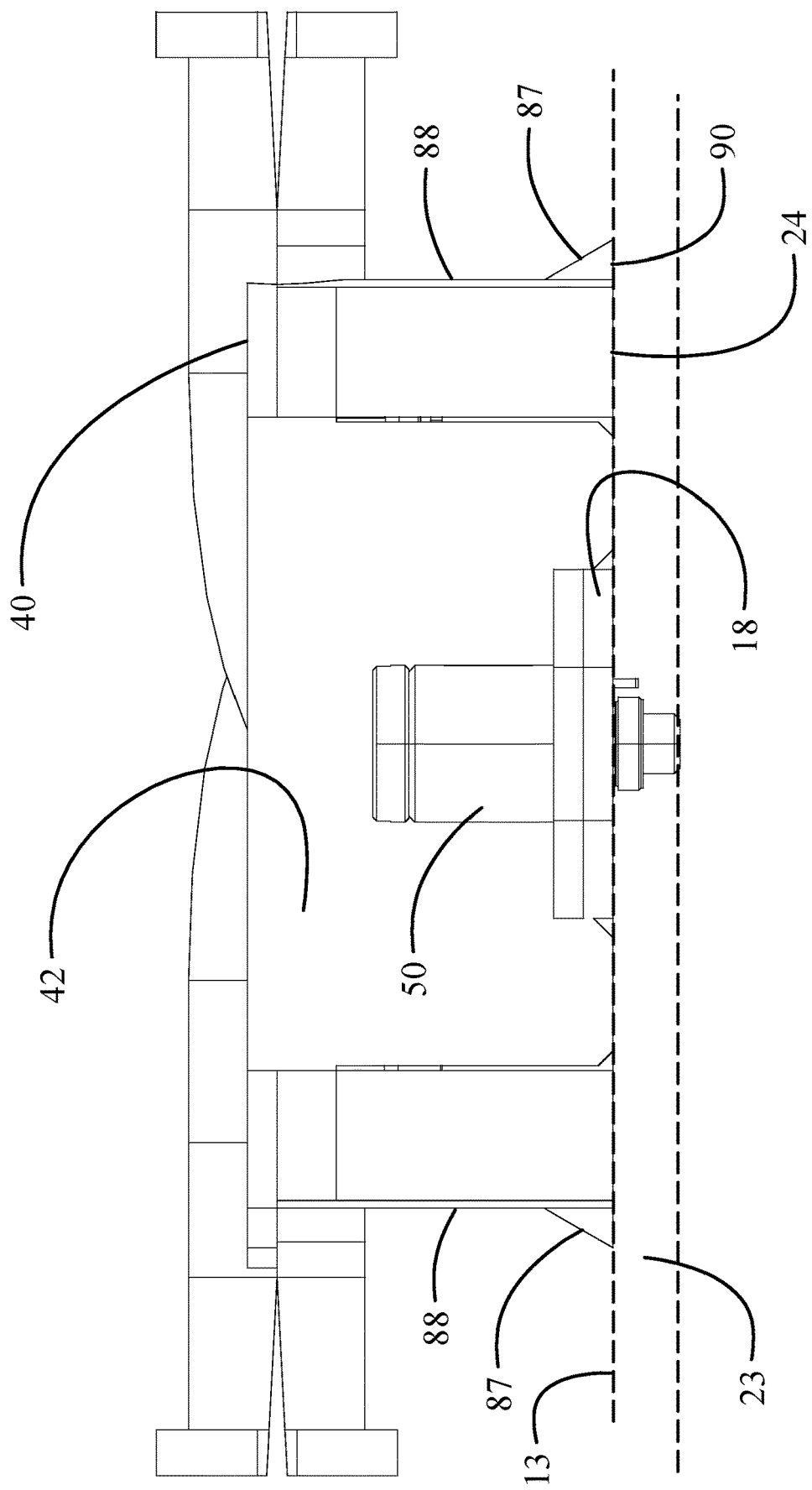
FIG. 11 is a side view of the fourth implementation.
Figure 12:
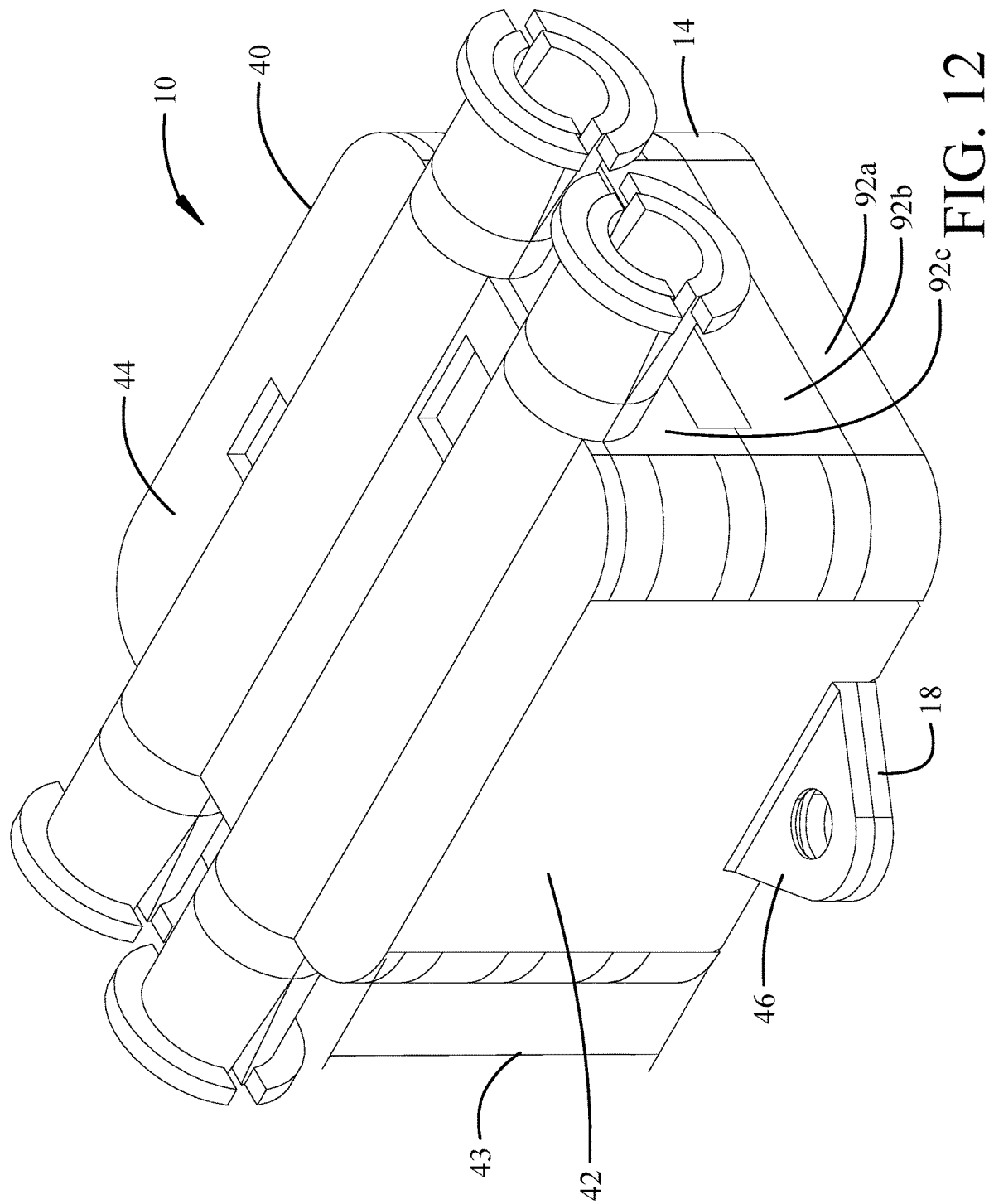
FIG. 12 is a pictorial view of a multi-tiered implementation for a plurality of circuit boards.
Figure 13:
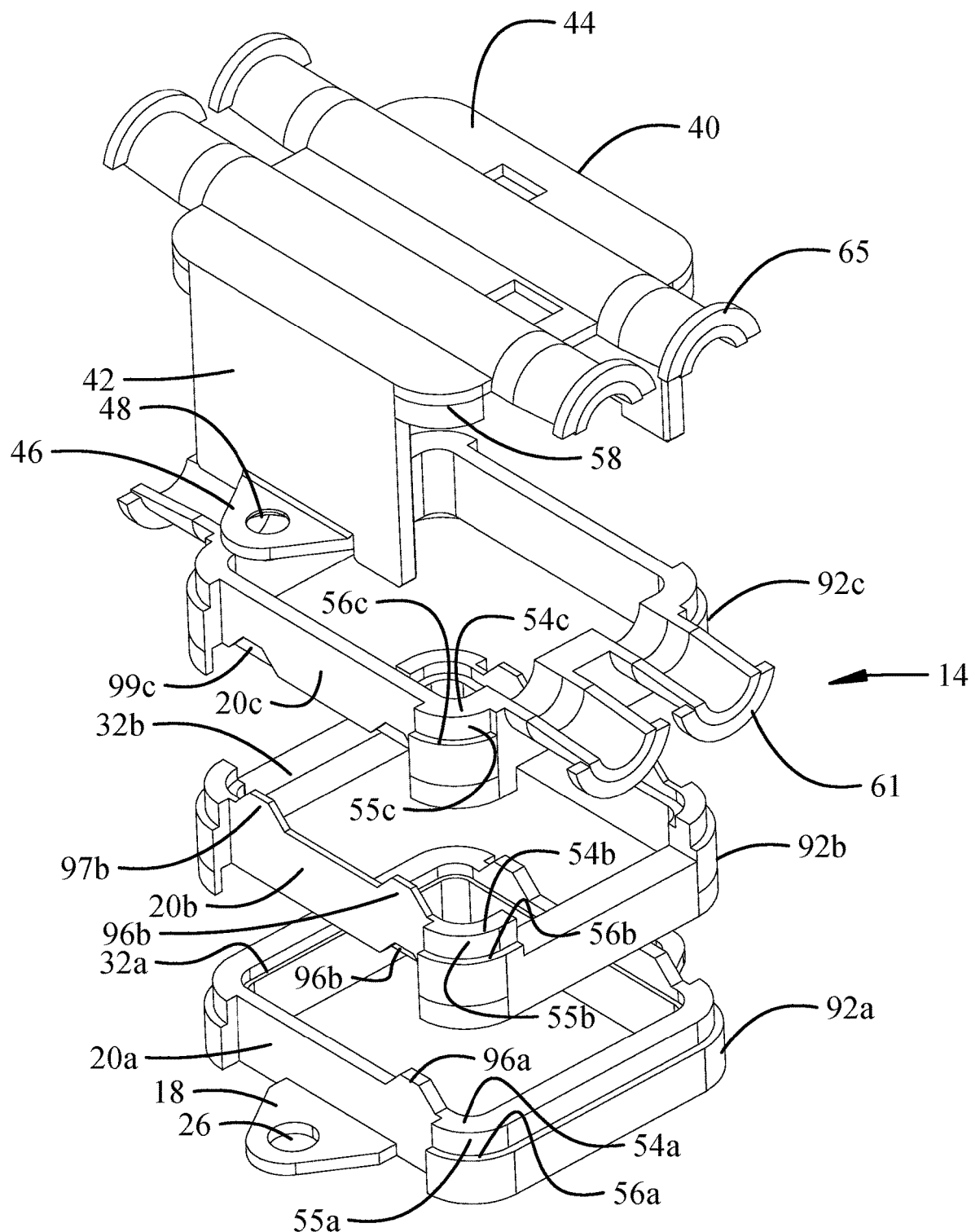
FIG. 13 is an exploded view of the multiple tiers and cover.
Figure 14:
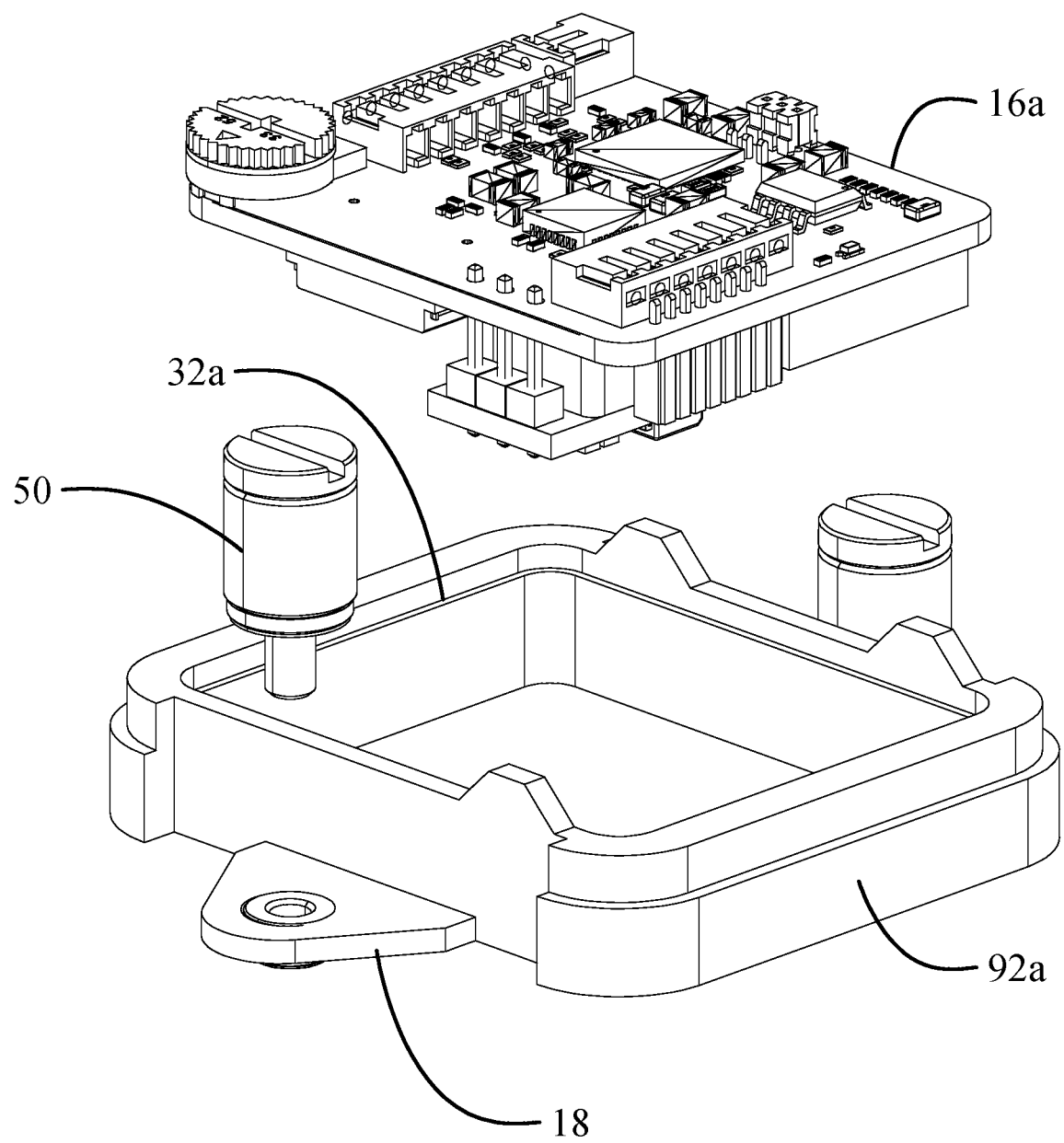
FIG. 14 is an exploded pictorial representation of the bottom tier and associated circuit board.
Figure 15:
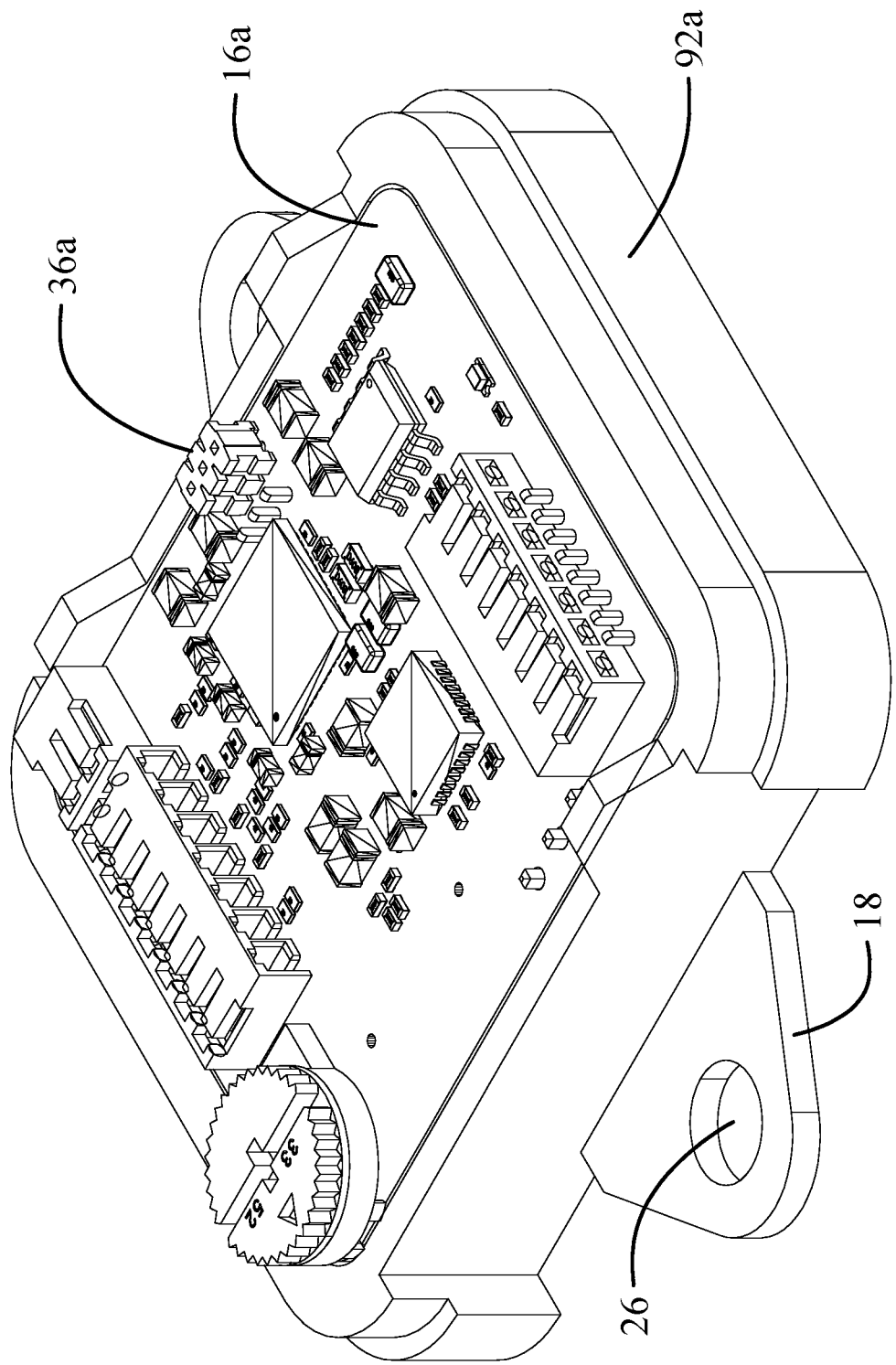
FIG. 15 is an upper pictorial representation of the bottom tier with the supported circuit board.

A further enhanced strain relief configuration of the PCB enclosure 10 is shown in a fourth implementation seen in FIGS. 10 and 11. The configuration of the box 14 and cover 40 is substantially as described with respect to the first implementation. As with the second implementation described, half tubes 61 and mating retention tubes 65 of the fourth implementation employ chamfers 86 and are similar in operation to those of the second implementation. Tapering chamfers 86 provide clearance between the half tubes 61 and mating retention tubes 65 for clamping by tubing clamps or similar devices to enhance the engagement of the paired half tubes 60 and mating retention tubes 65 with the extending wire harnesses. Additionally, the box 14 incorporates stabilizing wedges 87 extending from the sides 88 of the box perpendicular to the side plates 20 and having bottom surfaces 90 coplanar with the bottom surface 24 of the box and securing tabs 18 for engagement with the top surface of the main circuit board 12. The half tubes 61 and mating retention tubes 64 of the harness conduits also extend from the sides 88 and the lengthened footprint of the box 14 provided by the stabilizing wedges 87 extending onto the top surface 13 of the main circuit board 12 more easily reacts moments created by the wire harnesses extending from the harness conduits to stabilize the PCB enclosure on the main circuit board 12.

The PCB enclosure 10 may also be employed for a plurality of circuit boards to be mounted to the main circuit board 12 as seen in a fifth implementation shown in FIGS. 12-17. The box 14 has multiple tiers 92*a*, 92*b*, 92*c* configured to join at the periphery. For the example implementation shown, three tiers are present. A bottom or first tier 92*a* has tabs 18 extending laterally from side plates 20*a* (seen in FIG. 13) similar to the first described implementation. Bottom surfaces 22 of the securing tabs 18 are coplanar extensions of a bottom surface 24 of the box 14 for flush fit against the main circuit board 12. The securing tabs 18 are configured with apertures 26 sized to received industry standard printed circuit board swaging nuts 28 (as previously described and seen FIGS. 3 and 4) on the main circuit board 12. This again provides registration for both the box 14 and for the supported circuit board 16 relative to the main circuit board 12. Upper corners 54*a* of the bottom tier 92*a* have recesses (annotated as element 55*a*) with terminating flats 56*a* that receive lips 58*b* extending downward from the lower corners 94*b* of the second tier 92*b*. Similarly, upper corners 54*b* of the second tier 92*b* have recesses (annotated as element 55*b*) with terminating flats 56*b* that are configured to receive lips 58*c* extending downward from the lower corners 94*c* of the third tier 92*c*.

A cover 40 is received on the box 14 to close the open top of the box 14. Side flanges 42 extend downwardly from a top plate 44 of the cover 40. Mating tabs 46 extend laterally from the side flanges 42 and are aligned with the securing tabs 18 in the bottom tier 92*a*. Mating apertures 48 in the mating tabs 46 align with the apertures 26 in the securing tabs 18. Fasteners 50 extend through the mating apertures 48 to be received in the swaging nuts 28 thereby engaging the cover 40 to the box 14 and further securing the complete PCB enclosure 10 to the main circuit board 12. The side plates 20*a*, 20*b* and 20*c* in each of the three tiers 92*a*, 92*b* and 92*c* incorporate recesses and the side flanges 42 are received in the recesses providing flush outer side surfaces of the PCB enclosure 10. The upper corners 54*c* of top tier 92*c* have recesses (annotated as element 55*c*) with terminating flats 56*c* that receive lips 58 extending downward from the top plate 44.

Mating indicia provide for proper clocking of the three tiers. For the exemplary implementation, side plates 20*a* and 20*b* in the bottom tier and second tier, respectively, each have an extending male tab 96*a* and 96*b* which is received in female recesses 98*b* and 98*c* providing the mating indicia. For the example implementation, the middle tier 92*b* has a second extending male tab 97*b* which is received in a mating female recess 99*c* in the third tier 92*c* to assure that the tiers are stacked in proper sequence. In implementations with additional tiers, additional pairs of male tabs and female recesses are incorporated on the side plates or end walls of the tiers. In alternative implementations a single pair of mating male tabs and female recesses with differing clocking on the periphery of the tiers may be employed.

Figure 16:
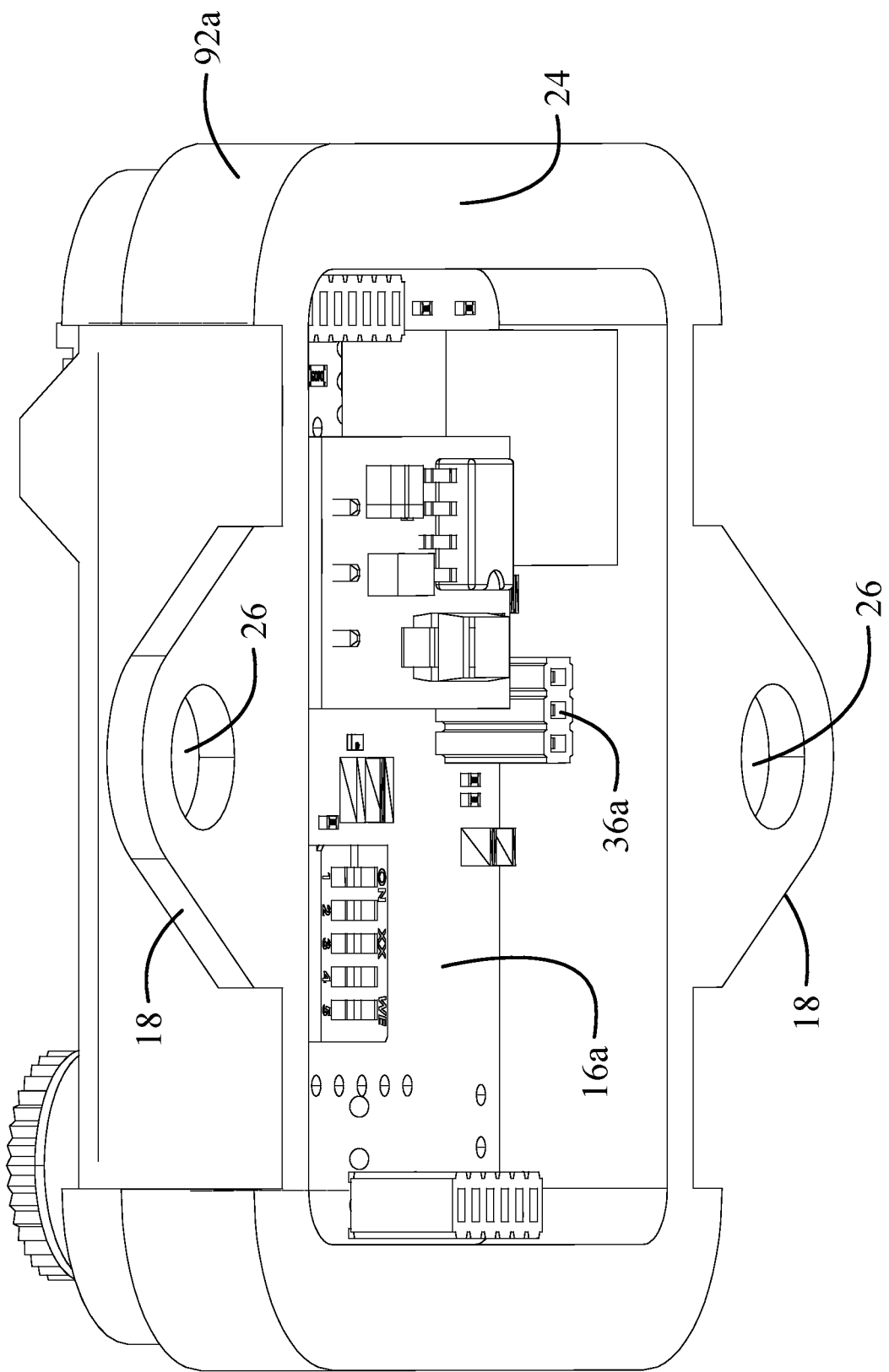
FIG. 16 is a lower pictorial representation of the bottom tier with the supported circuit board.
Figure 17:
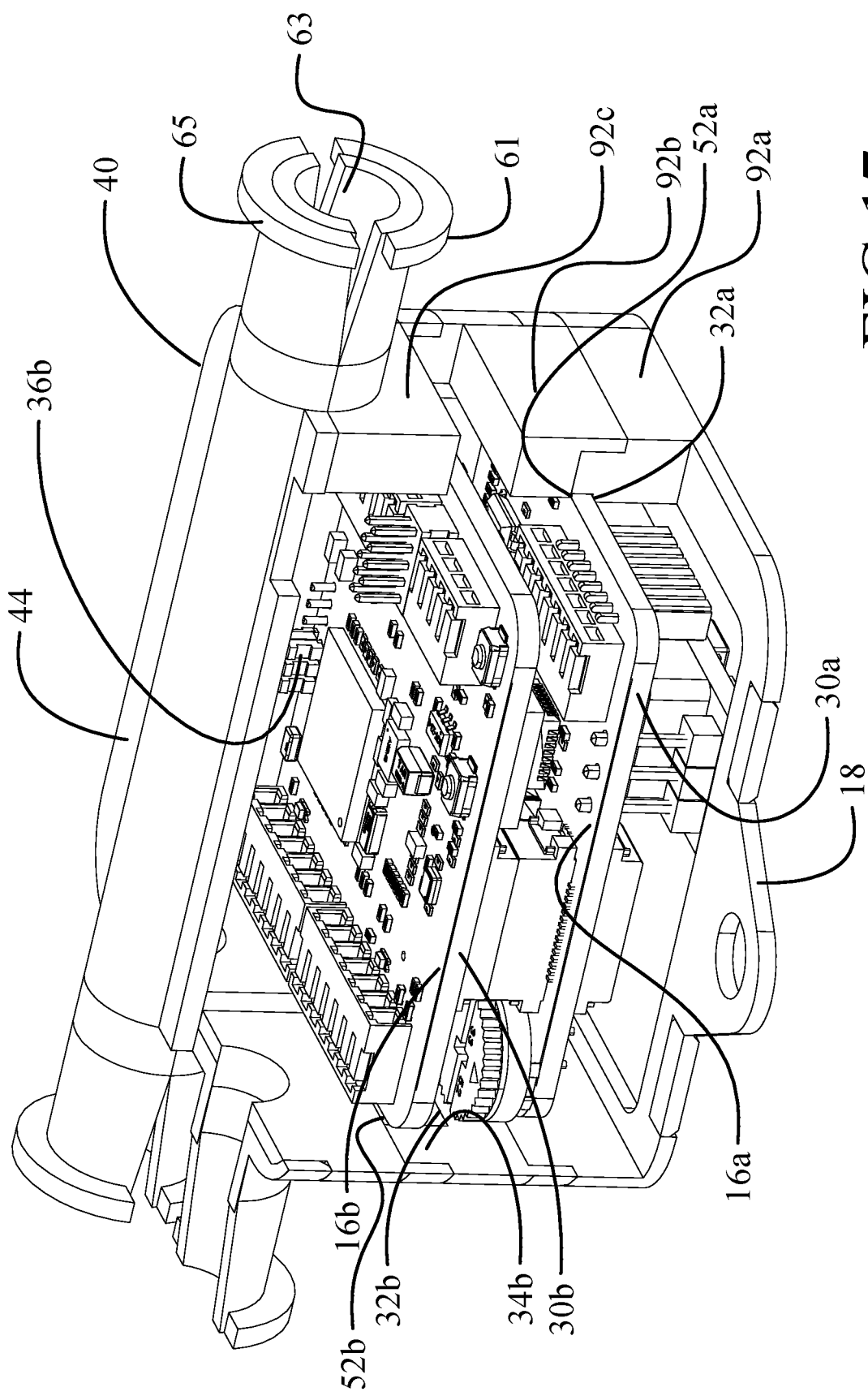
FIG. 17 is a partial cutaway pictorial representation of the PCB enclosure with first and second circuit boards mounted in the bottom and second tier and the third tier and cover installed; and, FIG. 18 is a flow chart of a method for mounting of circuit boards to a main circuit board employing the described implementations.

A plurality of circuit boards may each be supported by one of the plurality of tiers. For the example implementation, a first circuit board 16*a* is supported by the bottom or first tier 92*a*. The first circuit board 16*a* is received in the first tier 92*a* as seen in FIGS. 16 and 17 and a bottom surface 17*a* of the circuit board 16*a* is supported proximate peripheral edges 30*a* on a saddle flange 32*a*. Peripheral edges 30*a* of the circuit board 16*a* are laterally constrained by the inner walls 34*a* of the first tier 92*a*. As the circuit board 16*a* is pressed onto the saddle flange 32*a*, one or more high-density connectors 36*a* are properly aligned to matching plugs on the main circuit board 12 based on alignment and clocking of the securing tabs 18. Similarly, a second circuit board 16*b* is supported by the second tier 92*b*. The second circuit board 16*b* is received in the second tier 92*b* as seen in FIG. 17 and a bottom surface 17*b* of the second circuit board 16*b* is supported proximate peripheral edges 30*b* on a saddle flange 32*b*. Peripheral edges 30*b* of the second circuit board 16*b* are laterally constrained by the inner walls 34*b* of the second tier 92*b*. As the second circuit board 16*b* is pressed onto the saddle flange 32*b*, one or more high-density connectors 36*b* are properly aligned to matching plugs on the first circuit board 16*a* based on alignment and clocking of the male tabs 96*b*, 97*b* and female recesses 98*b*, 99*b*. Each tier incorporates a step 52*a*, 52*b* which engages the top surface of the respective circuit board 16*a*, 16*b* to constrain the circuit board against the respective saddle flange 32*a*, 32*b*.

A third circuit board may be similarly installed and supported in the third tier 92*c*.

As in the prior implementation, a plurality of half tubes 61 are incorporated in an upper edge 62 of the third tier 92*c* extending laterally from the box 14. Braided cables received in connectors 36*b* on the second circuit board 16*b* are laid through the half tubes 61 as the circuit board 16 is inserted in the box. Connection of high-density connectors between the first and second circuit boards, as previously described allows connection of the first circuit board to the cables. The cover 40 includes mating retention tubes 65 concentrically engaging the half tubes 61 forming harness conduits 63. The harness conduits 63 may employ chamfered half tubes and retention tubes as described in the second implementation. After insertion of the circuit boards 16*a* and 16*b* in the first and second tiers of the box 14 (and circuit boards in the third or subsequent tiers), the cover 40 is engaged to the box 14 with the side flanges 42 received in the recesses in the side plates 20*a*, 20*b* 20*c* of each of the tiers, trapping both the enclosed circuit boards, as previously described, and the associated wire harnesses. The use of the swage nuts allows the top cover to be securely fastened down. The length 43 of the side flanges 42 and engagement of the mating tabs 46 on the securing tabs 18 again controls the height of the installation to reduce any potential for over torqueing. Once tightened down with the fasteners 50, the cover 40 and box 14 fully trap the enclosed circuit boards and the wire harnesses, distributing any pulling load through the box and to the main circuit board 12 and swage nuts rather than the enclosed circuit board 16. For the example implementation in FIGS. 12-17, four half tubes 61 and mating retention tubes 65 for harness conduits are employed.

While swage nuts and associated mating fasteners have been described in the exemplary implementations for engaging the cover to the box and box to the main circuit board, alternative forms of fasteners may be employed, including such elements as zip ties. Additionally, fastening adjacent tiers in a box having a plurality of tiers or fastening the enclosure to the main circuit board may also be accomplished or supplemented by the use of snap fit features.

Figure 18:
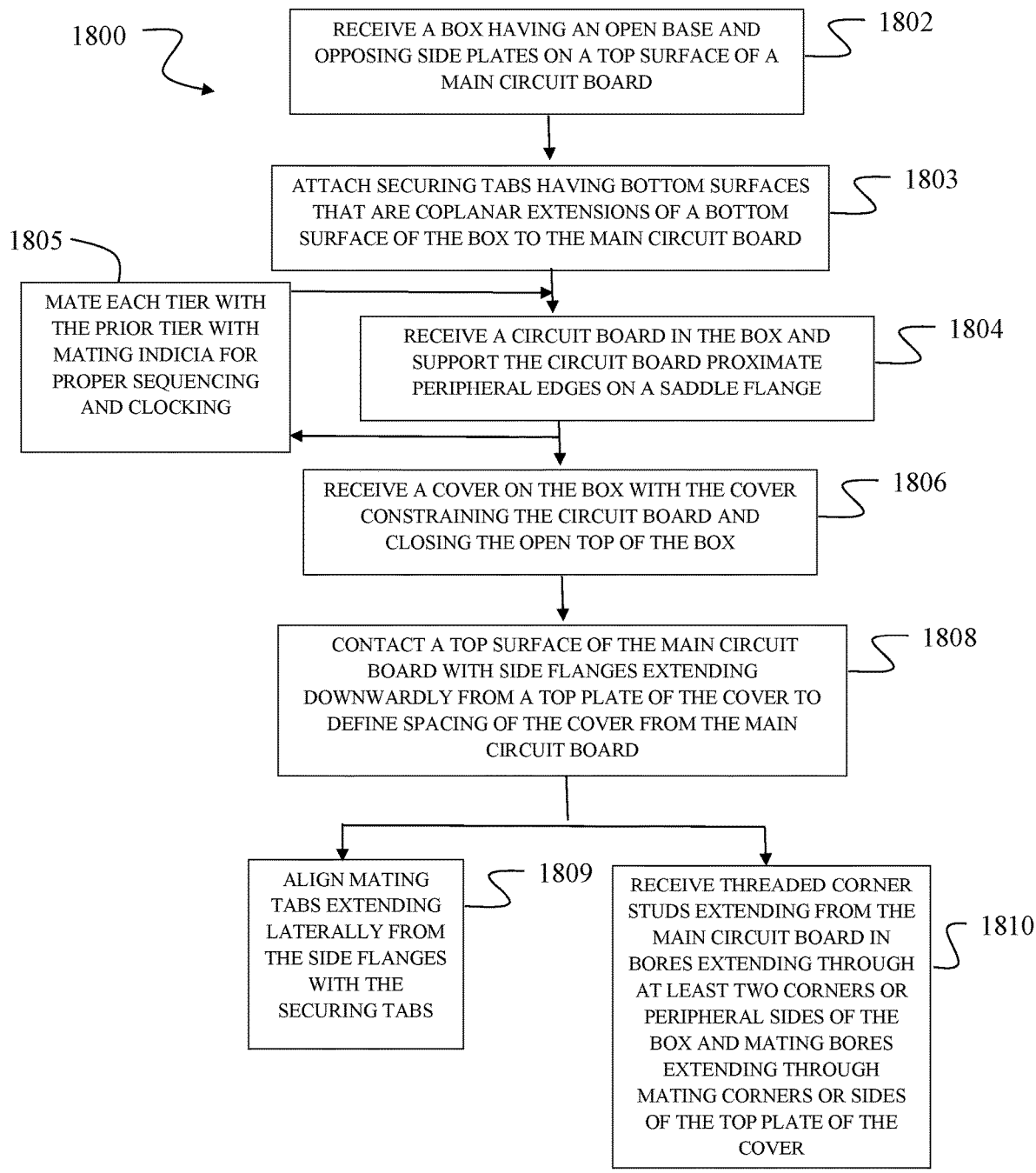

The described implementations provide for a method 1800 of mounting circuit boards to a main circuit board as shown in FIG. 18. A box 14 having an open base and opposing side plates 20 is received on a top surface 13 of a main circuit board 12, step 1802. In one implementation, securing tabs 18 having bottom surfaces that are coplanar extensions of a bottom surface 24 of the box are attached to the main circuit board, step 1803. A circuit board 16 is received in the box 14 and supported proximate peripheral edges 30 on a saddle flange 32, step 1804. A cover 40 is received on the box, step 1806, with the cover constraining the circuit board and closing the open top of the box. The cover has side flanges 42 extending downwardly from a top plate 44 contacting a top surface 13 of the main circuit board 12, step 1808, to define spacing of the cover from the main circuit board. In the first implementation mating tabs 46 extending laterally from the side flanges are aligned with the securing tabs 18, step 1809. In a second implementation, threaded corner studs 70 extending from the main circuit board 12 are received in bores 72 extending through at least two corners 74 or peripheral sides of the box and mating bores 73 extending through mating corners 76 or sides of the top plate 44 of the cover, step 1810. In implementations with multiple tiers in the box 14, step 1804 is repeated for each tier and each tier is mated with the prior tier, step 1805, with mating indicia for proper sequencing and clocking.

Having now described various implementations of the invention in detail as required by the patent statutes, those skilled in the art will recognize modifications and substitutions to the specific implementations disclosed herein. Such modifications are within the scope and intent of the following claims. Within the specification and the claims the terms "comprising", "incorporate", "incorporates" or "incorporating", "include", "includes" or "including", "has", "have" or "having", and "contain", "contains" or "containing" are intended to be open recitations and additional or equivalent elements may be present. The term "substantially" as used within the specification and claims means that the recited characteristic, parameter, or value need not be achieved exactly, but that deviations or variations, including for example, tolerances, measurement error, measurement accuracy limitations and other factors known to those skilled in the art, may occur in amounts that do not preclude the effect the characteristic was intended to provide. As used herein the terms "upper" and "lower" and "upward" and "downward" are employed to describe relative positioning and other than for the specific implementations disclosed may be substituted with appropriate descriptors such as "first" and "second", "top" and "bottom" or "right" and "left" depending on orientation of actual implementation.

What is claimed is:

1. An enclosure comprising:
a box having an open base, open top and opposing side plates;
securing tabs extending laterally from the side plates, said securing tabs having bottom surfaces that are coplanar extensions of a bottom surface of the box, said securing tabs configured to be attached to a main circuit board; and
a cover received on the box, said cover configured to close the open top of the box, said cover having side flanges extending downwardly from a top plate with mating tabs extending laterally from the side flanges aligned with the securing tabs wherein the side flanges are received in recesses in the side plates thereby providing flush outer side surfaces of the PCB enclosure.

2. The enclosure of claim 1 wherein the securing tabs are configured with apertures sized to received printed circuit board swaging nuts on the main circuit board, engagement of the swaging nuts in the apertures providing registration for the box relative to the main circuit board.

3. The enclosure of claim 2 wherein the mating tabs have mating apertures aligned with the apertures in the securing tabs and further comprising fasteners extending through the mating apertures to be received in the swaging nuts thereby engaging the cover to the box and further securing a complete PCB enclosure comprising the box and cover to the main circuit board.

4. The enclosure of claim 1 wherein the box comprises a plurality of tiers.

5. The enclosure of claim 4 wherein each of the plurality of tiers incorporates mating indicia for clocking.

6. The enclosure of claim 4 wherein upper corners of each tier have recesses with terminating flats configured to receive lips extending downward from a next one of the plurality of tiers or the top plate.

7. The enclosure of claim 4 wherein each of the plurality of tiers has side plates and the side flanges are received in recesses in the side plates thereby providing flush outer side surfaces of the PCB enclosure.

8. The enclosure of claim 4 wherein each respective tier of the plurality of tiers has a saddle flange to support a respective one of a plurality of circuit boards received in the box, a bottom surface of each circuit board supported proximate peripheral edges on the saddle flange in the respective tier, and each respective tier incorporates steps engaging a top surface of the respective one of the plurality of circuit boards proximate the peripheral edges thereby trapping the respective one circuit board in engagement with the saddle flange.

9. An enclosure comprising:
a box having an open base, open top and opposing side plates wherein the box incorporates a saddle flange;
a circuit board received in the box, a bottom surface of the circuit board supported proximate peripheral edges on the saddle flange and said peripheral edges of the circuit board are laterally constrained by inner walls the box;
securing tabs extending laterally from the side plates, said securing tabs having bottom surfaces that are coplanar extensions of a bottom surface of the box, said securing tabs configured to be attached to a main circuit board; and a cover received on the box, said cover configured to close the open top of the box, said cover having side flanges extending downwardly from a top plate with mating tabs extending laterally from the side flanges aligned with the securing tabs.

10. The enclosure of claim 9 further comprising:
a plurality of half tubes incorporated in an upper edge of the box extending laterally from the box, said half tubes configured to receive braided cables engaged in connectors on the circuit board; and
said cover including mating retention tubes concentrically engaging the half tubes forming harness conduits.

11. The enclosure of claim 9 wherein the side flanges incorporate steps engaging a top surface of the circuit board proximate the peripheral edges thereby trapping the circuit board in engagement with the saddle flange;
and wherein upper corners of the box have recesses with terminating flats configured to receive lips extending downward from the top plate.

12. The enclosure of claim 11 wherein a length of the side flanges and engagement of the mating tabs on the securing tabs with engagement of the terminating flats and lips controls the height of the installed cover.

13. The enclosure of claim 9 wherein the securing tabs are configured with apertures sized to received printed circuit board swaging nuts on the main circuit board, engagement of the swaging nuts in the apertures providing registration for the box relative to the main circuit board.

14. The enclosure of claim 13 wherein the mating tabs have mating apertures aligned with the apertures in the securing tabs and further comprising fasteners extending through the mating apertures to be received in the swaging nuts thereby engaging the cover to the box and further securing a complete PCB enclosure comprising the box and cover to the main circuit board.

15. The enclosure of claim 9 wherein the box comprises a plurality of tiers.

16. The enclosure of claim 15 wherein each of the plurality of tiers incorporates mating indicia for clocking.

17. The enclosure of claim 15 wherein upper corners of each tier have recesses with terminating flats configured to receive lips extending downward from a next one of the plurality of tiers or the top plate.

18. A method of mounting circuit boards to a main circuit board, the method comprising:
receiving a box having an open base and opposing side plates on an top surface of a main circuit board;
receiving a circuit board in the box, a bottom surface of the circuit board supported proximate peripheral edges on a saddle flange; and
receiving a cover on the box, said cover constraining the circuit board and closing the open top of the box, said cover having side flanges extending downwardly from a top plate contacting a top surface of the main circuit board.

19. The method of claim 18 further comprising:
attaching securing tabs having bottom surfaces that are coplanar extensions of a bottom surface of the box to the main circuit board; and
aligning mating tabs extending laterally from the side flanges with the securing tabs.

20. The method of claim 18 further comprising:
receiving threaded corner studs extending from the main circuit board in bores extending through at least two corners of the box and mating bores extending through mating corners of the top plate of the cover.

* * * * *